(12) United States Patent
Cui

(10) Patent No.: US 8,085,868 B2
(45) Date of Patent: Dec. 27, 2011

(54) PHASE MODULATING AND COMBINING CIRCUIT

(75) Inventor: Yan Cui, Gurnee, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 2184 days.

(21) Appl. No.: 10/980,707

(22) Filed: Nov. 3, 2004

(65) Prior Publication Data

US 2006/0093064 A1     May 4, 2006

(51) Int. Cl.
*H04K 1/02*     (2006.01)
*H04L 25/03*    (2006.01)
*H04L 25/49*    (2006.01)

(52) U.S. Cl. ...................................................... 375/297

(58) Field of Classification Search .................. 375/297, 375/295; 455/130, 20, 333, 126
See application file for complete search history.

(56) References Cited

U.S. PATENT DOCUMENTS

| | | | | |
|---|---|---|---|---|
| 4,896,156 A * | 1/1990 | Garverick | ...................... | 341/143 |
| 5,561,401 A * | 10/1996 | Mineo | ............................ | 332/103 |
| 5,574,755 A * | 11/1996 | Persico | ......................... | 375/295 |
| 5,835,850 A * | 11/1998 | Kumar | ........................ | 455/67.14 |
| 5,920,808 A * | 7/1999 | Jones et al. | ................ | 455/127.1 |
| 5,995,819 A * | 11/1999 | Yamaji et al. | ................. | 455/326 |
| 6,480,046 B1 * | 11/2002 | Camp, Jr. | ....................... | 327/122 |
| 6,693,956 B1 * | 2/2004 | Yamamoto | .................... | 375/219 |
| 7,031,668 B2 * | 4/2006 | Darabi et al. | ................... | 455/75 |
| 7,065,330 B2 * | 6/2006 | Klingberg et al. | ............ | 455/126 |
| 7,072,626 B2 * | 7/2006 | Hadjichristos | ............... | 455/126 |
| 7,110,732 B2 * | 9/2006 | Mostafa et al. | ............... | 455/130 |
| 7,248,625 B2 * | 7/2007 | Chien | ........................... | 375/219 |
| 7,271,674 B1 * | 9/2007 | Butenhoff et al. | ............ | 331/183 |
| 2004/0021516 A1 * | 2/2004 | Oishi et al. | ..................... | 330/149 |
| 2004/0219891 A1 * | 11/2004 | Hadjichristos | ............... | 455/102 |
| 2006/0017595 A1 * | 1/2006 | Van Veldhoven et al. | ..... | 341/143 |
| 2006/0068746 A1 * | 3/2006 | Feng et al. | ..................... | 455/323 |

OTHER PUBLICATIONS

Benjamin Sam, Philip Halford, High-perfomance Quadrature Modulators for Broadband Wireless Communication, 2001, IEEE, Radio Frequency integrated circuit symposium, p. 17-20.*
Junji Ihoh, Mitsuru Nishitsuji, Osamu Ishikawa, Daisuke Ueda, 2.1 GHz Direct-Conversion GaAs Quadrature Modulator IC of W-CDMA Base Station, 1999, IEEE, International Solid-stated Circuit Conference, p. 226-227, 463.*
Jouko Vankka, Johan Sommarek, Jaakko Ketola, Ilari Teikari, Kari A. I. Halonen, A Digital Quadrature Modulator With On-Chip D/A converter, 2003, IEEE, Journal of Solid-State Circuits, vol. 38, No. 10, Oct. 2003.*
Jouko Vankka, Marko Kosunen, Ignacio Sanchis, Kari A. I. Halonen, A Multicarrier QAM Modulator, IEEE, Jan. 2000, Analog and Digital Signal Processing, vol. 41, No. 1, pp. 1-10.*

(Continued)

*Primary Examiner* — David C. Payne
*Assistant Examiner* — Tanmay Shah
(74) *Attorney, Agent, or Firm* — Lempia Summerfield Katz LLC

(57) ABSTRACT

A transmitter includes a modulating and combining circuit to which signals are supplied and modulated into in-phase and quadrature-phase signals. The in-phase and quadrature-phase signals are combined in a closed-loop voltage summing circuit. The voltage summing circuit is an amplifier using capacitors as negative feedback elements. The negative feedback improves the linearity of the modulator. An LC tank circuit at the output of the voltage summing circuit bandpass filters the output before being applied to a power amplifier and eventually transmitted by an antenna. A multi-summing amplifier with different frequency tuning can be used for a multi-band transmitter design.

22 Claims, 5 Drawing Sheets

OTHER PUBLICATIONS

Jouko Vankka, Mauri Honkanen, Kari A. I. Halonen, A Multicarrier GMSK Modulator, Jun. 2001, IEEE Journal on Selected Areas inCommunications, vol. 19, No. 6, p. 1070-1079.*

Junji Itoh, Mitsuru Nishituji, Ssamu Kshikawa, Daisuke Udea, 2.1 GHz Direct-Conversion GaAs Quadrature Modulator IC for W-CDMA Base Station, 1999 IEEE International Solid-state circuit conference.*

Otaka et al. A local input 1.9 GHz Si-bipolar quadrature modualtor with no adjustments, IEEE, 1999.*

Vakka et al., A multicarrier GMSK modulator, IEEE, 2001.*

Shoji Otaka, Takafumi Yamaji, Ryuichi Fujimoto, Chikau Takahashi and Hiroshi Tanimoto, *A Low Local Input 1.9 GHz Si-Bipolar Quadrature Modulator with No Adjustment*, pp. 30-37, IEEE Journal of Solid-State Circuits, vol. 31, No. 1, Jan. 1996.

* cited by examiner

PHASE MODULATING AND COMBINING CIRCUIT

BACKGROUND

The present invention relates to a transmitter. More specifically, the present invention relates to transmitter using a phase modulating and combining circuit.

The variety of portable electronic devices as well as the usage of such devices has dramatically increased in recent years. This is especially true of mobile handsets, which are presently used by a large proportion of the populations in the United States, Europe, and Japan, for example. Mobile handsets contain modulators that enable wireless transmissions by permitting complex modulation formats that support modern, high-data-rate wireless communications.

As in a vast majority of portable electronic devices, there is a demand to decrease the cost, size and number of parts in mobile handsets and the components used therein. However like other components, the transmitters used in mobile handsets have multiple types of problems that must be addressed in the design stage. Inevitably, these design solutions limit the amount of cost, part and size reduction that can take place.

One example of particular problems faced by transmitters is precise control of transmitter power. Control of this power is desirable at least to avoid power wastage and increase the amount of usable time before the battery needs to be recharged as well as decreasing the amount of interference. As most of the circuitry in transmitters is integrated, to improve semiconductor yield and lower the manufacturing cost, meeting the power specifications between the transmitter and cellular tower for all transmitter process variations during manufacture is relatively difficult. In addition to taking account of the effects of process variations on output power, the transmitter power specification also takes into account large changes in the ambient temperature when using the mobile handset in order to meet the communication standard used by the mobile handset. This is because as the ambient temperature varies, the transmitting power of the mobile handset varies concomitantly; for example, if the transmitting power is too high, the signal can bury other signals used in communications with the cell tower.

Besides precise power control, other problems of the transmitter are addressed in designing the transmitter architecture. These additional problems include relatively low third-order intermodulation and high phase noise in signals from the transmitter. Third-order intermodulation becomes more problematic as the signal is usually amplified between the modulator and the antenna, causing interference between adjacent channels. Accordingly, having a high third-order intermodulation improves the adjacent channel power rejection.

In addition to third-order intermodulation requirements, low noise power output at some specified frequency offset from the carrier is required for most communication protocols, such as the Global System for Mobile Communications (GSM) or Code Division Multiple Access (CDMA) to reduce interference in the receiver. Also, in conventional transmitter modulators, a harmonic-rich square wave is applied to the modulator as a local oscillator signal. This results in an output that is also rich in harmonics and requires filtering before being transmitted by the antenna.

A surface acoustic wave (SAW) filter disposed between the modulator and power amplifier is used to decrease the phase noise and harmonics of the signals from the modulator to acceptable levels in conventional transmitters. SAW filters have an inherent insertion loss associated with introducing the filter into the signal stream. This insertion loss is relatively large, usually about 3 dB. Use of a SAW filter also increases the size and the cost of the overall transmitter. Further, the SAW filter has inherent power limitations which may become problematic depending on the transmitter design; if the signal supplied to the SAW filter is too large, the filter can be damaged and, accordingly, then fail to operate properly.

BRIEF SUMMARY

The use of negative feedback in a transmitter modulator and combining circuit mitigates at least some of the problems associated with transmitters and permits the use of fewer components. Most notably, the modulator and combining circuit may eliminate use of a SAW filter in the transmitter downstream of the modulator and combining circuit (i.e. between the modulator and combining circuit and the power amplifier). Using a capacitive negative feedback keeps the noise low, aids in maintaining the linearity of the transmitter, and decreases the dependence of the output on the transconductance of the summing amplifier (or differential amplifier) in the modulator and combining circuit without decreasing stability of the transmitter at the frequency bands used.

Accordingly and by way of introduction only, in one aspect, a communication circuit includes a summing circuit, a differential amplifier and a feedback circuit. The summing circuit is adapted to supply a first sum containing an in-phase signal and a quadrature-phase signal, and a second sum containing an inverted in-phase signal and an inverted quadrature-phase signal. The differential amplifier contains inputs and outputs adapted to receive the first and second sums through first elements, such as capacitors, of the summing circuit. The feedback circuit contains second elements, such as capacitors, connected between the inputs and outputs of the differential amplifier. LC tank circuits connect with the outputs of the differential amplifier. The communication circuit may be a transmitter.

In another aspect, a transmission system includes a D/A converter, a modulating and combining circuit disposed downstream from the D/A converter, a power amplifier connected downstream of the modulating and combining circuit, and an antenna connected downstream of the power amplifier. The D/A converter is adapted to receive digital data. The modulating and combining circuit has a summing circuit and a differential amplifier. The summing circuit supplies combinations of an in-phase signal, a quadrature-phase signal, an inverted in-phase signal, and an inverted quadrature-phase signal to inputs of the differential amplifier. The differential amplifier has negative feedback between the inputs and outputs. The negative feedback may contain capacitors. An LC tank circuit in the modulating and combining circuit may provide bandpass filtering. Additional filtering may be provided by a low pass filter downstream of the modulating and combining circuit.

In another aspect, a communication method includes modulating analog signals in a modulating and combining circuit of a communication circuit (such as a transmitter) to form an in-phase signal, a quadrature-phase signal, an inverted in-phase signal and an inverted quadrature-phase signal; summing the analog signals to form a first summed signal containing the in-phase signal and the quadrature-phase signal and to form a second summed signal containing the inverted in-phase signal and the inverted quadrature-phase signal; and providing the first and second summed signals to different inputs of a differential amplifier as well as providing negative feedback between the inputs and outputs of the differential amplifier.

The foregoing summary has been provided only by way of introduction. Nothing in this section should be taken as a limitation on the following claims, which define the scope of the invention.

DETAILED DESCRIPTION OF THE EMBODIMENTS

The quadrature phase modulator has gained popularity in the mobile handset market due to the ever-increasing desire to decrease the cost, size and number of parts in the transmitter integrated circuit. The quadrature phase modulator is used for both continuous phase modulation, such as Gaussian Minimum Shift Keying (GMSK) and frequency modulation (FM), and discrete phase modulation, such as Quadrature Phase Shift Keying (QPSK). A transmitter using this type of modulator not only supports a multi-modulation standard, but also fits very well with existing digital radio base-band and firmware.

In the modulator, the in-phase and quadrature-phase outputs are combined through a modulating and combining circuit. The modulating and combining circuit contains a closed-loop amplifier that uses capacitors as negative feedback elements. Unlike a traditional current summing circuit in which the gain is determined by the transconductance (which in turn is highly dependent on ambient temperature and manufacturing process), the gain is very well controlled by the ratio of the capacitors if the open-loop gain of the amplifier is sufficiently large. The negative feedback improves the linearity of the modulator, especially the third-order intermodulation. The phase noise of the modulating and combining circuit is improved by the low pass filter formed by the capacitors in the feedback network. The modulating and combining circuit contains an inductor-loaded frequency tuning circuit. The frequency selectivity of this circuit helps reduce the harmonics of the square wave local oscillator. A multi-summing amplifier with different frequency tuning can be used for a multi-band transmitter design.

The transmitter topology can be applied to single band or multi-band and multi-standard CMOS transmitter designs. This topology is particularly useful for protocols such as CDMA which require precise control of the transmitter power.

Figure 1:
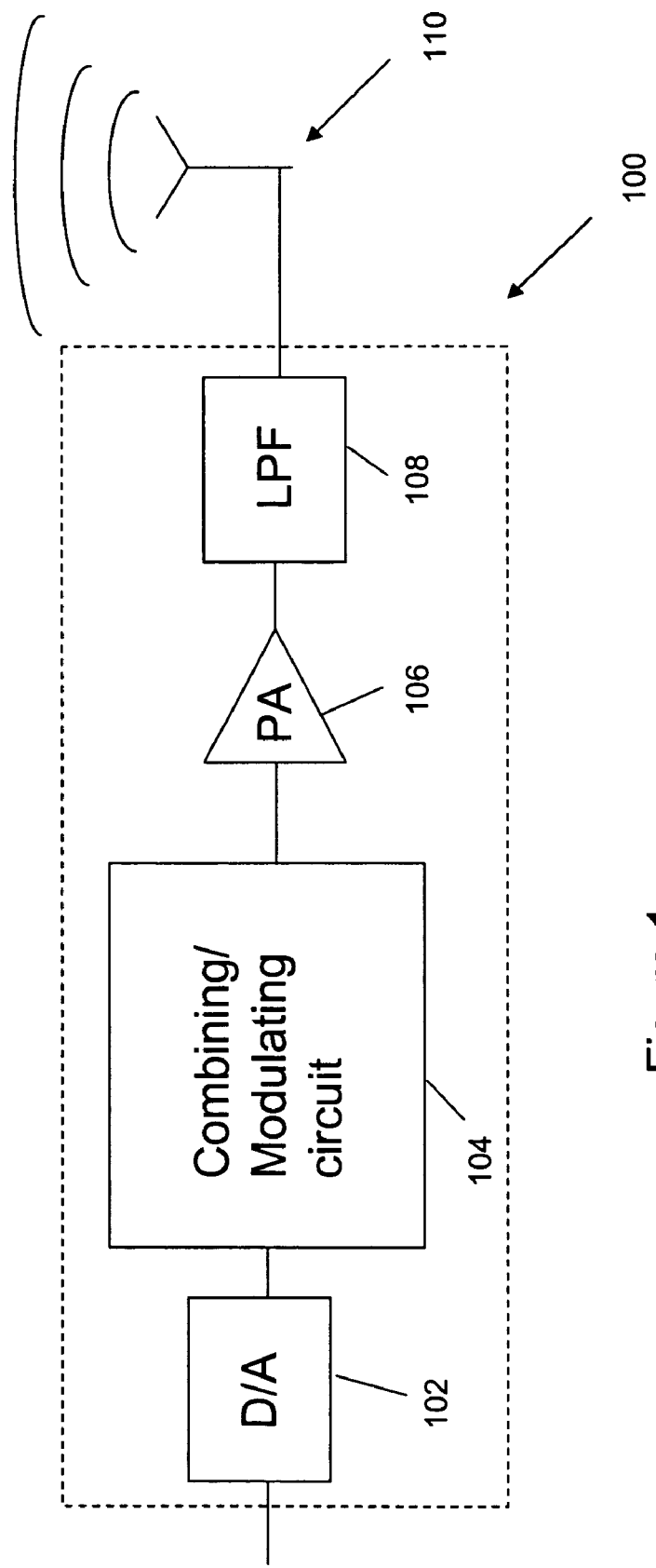
FIG. 1 illustrates an overall transmitter system in one embodiment.

FIG. 1 shows a block diagram of one embodiment of a transmission system that supports multi-band communications. This transmission system may use the direct launch architecture shown, which does not contain a SAW filter, or may use an architecture having a SAW filter. The transmission system contains a transmitter 100 and an antenna 110. The transmitter 100 includes a digital-to-analog (D/A) converter 102, a modulating and combining circuit 104, a power amplifier (PA) 106, and, if desired, a low-pass filter (LPF) 108. The D/A converter 102 receives digital data from other electronic components (not shown) to be transmitted and forms analog signals. The analog signals are supplied to the modulating and combining circuit 104 where they are modulated to form both non-inverted and inverted in-phase and quadrature-phase local oscillator signals. These local oscillator signals are then summed in various manners, amplified, bandpass filtered and then supplied to the power amplifier 106. The power amplifier 106 amplifies the signals and supplies them to the antenna 110, perhaps through the low-pass filter 108 if additional filtering is required. Other components readily apparent to one of skill in the art may be present in the transmission system, but are not shown here for clarity.

Figure 2:
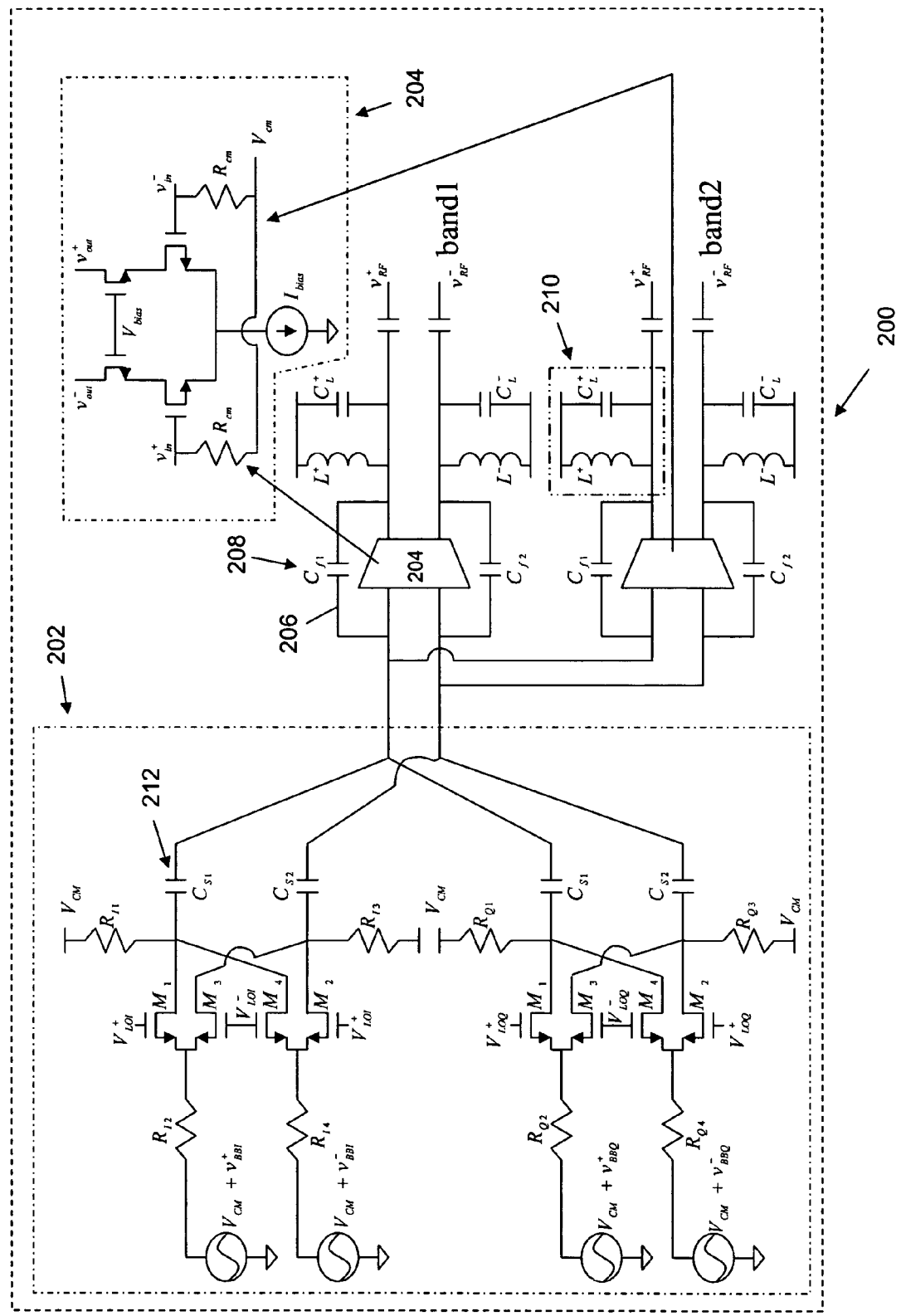
FIG. 2 shows a modulating and combining circuit in one embodiment.

FIG. 2 shows a block diagram of the circuit topology for the integrated modulating and combining circuit 104 in the transmitter 100 of FIG. 1. The modulating and combining circuit 200 in FIG. 2 contains several parts: a summing circuit 202, a differential amplifier 204 with a negative feedback loop 206, and a bandpass filter 210.

Signals supplied to the input of the modulating and combining circuit 200 modulate the transmit carrier from the local oscillator (LO). The modulating and combining circuit 200 contains a pair of matched bi-phase modulators in which the carrier is modulated by modulation signals. The modulation signals vary in phase by 90 degrees: $Vbbi^+=[\cos((\phi_i(t))]$, $Vbbi^-=[-\cos((\phi_i(t))]$, $Vbbq^+=[\sin((\phi_i(t))]$, and $Vbbq^-=[-\sin((\phi_i(t))]$. Four quadrature local oscillator signals are added to the signals to form an in-phase LO signal ($LOI^+$), a quadrature-phase LO signal ($LOQ^+$), an inverted in-phase LO signal ($LOI^-$), and an inverted quadrature-phase LO signal ($LOQ^-$).

In the summing circuit 202, each of the signals is supplied to the sources of a different pair of switches via a resistor ($R_{I2}$, $R_{I4}$, $R_{Q2}$, $R_{Q4}$). In the embodiment shown, the switches are CMOS transistors. The resistors may also be implemented by CMOS transistors. The pairs of transistors to which modulated signals of opposite polarity (180 degrees out of phase) are applied form a set of transistors. The gate of one transistor of each pair is supplied with an LO signal and the gate of the other transistor of each pair is supplied with the inverted LO signal having the opposite polarity as the LO signal. The drain of each of the transistors is connected to the common voltage via a different resistor ($R_{I1}$, $R_{I3}$, $R_{Q1}$, $R_{Q3}$). The drains of one of the transistors ($M_3$, $M_4$) in each pair of transistors ($M_1\&M_3$, $M_2\&M_4$) in a particular set of transistors are connected to the drains of the other of the transistors ($M_1$, $M_2$) in each pair of transistors in the particular set of transistors.

The transistors whose drains are connected (hereinafter referred to as cross-coupled transistors—$M_1\&M_4$, $M_2\&M_3$) have gates supplied with a LO signal of opposite polarities. The drain of each cross-coupled transistor in each set of transistors is supplied to different inputs of the differential amplifiers 204 through an input capacitor ($C_{S1}$, $C_{S2}$) 212. More specifically, the connected drains of cross-coupled transistors of different sets are 90 degrees out of phase and have gates connected to LO signals of the same polarity. The terms coupled and connected are used interchangeably herein and are not limited to direct connections between various circuit elements unless it is specifically noted that a direct connection exists. That is, circuit elements that are coupled or connected together in general may have one or more additional circuit elements between the coupled or connected circuit elements.

The gates of the transistors of each pair are supplied with signals of the same magnitude but opposite polarity. Accordingly, one of the transistors in the pair is on while the other is off (as long as the voltage applied to the gate is sufficient to form the channel). Thus, the signal from only one cross-coupled transistor is present on the connection to the associated capacitor. As shown by the Y-shaped connection, the signals are added together between the capacitors 212 and each input of the differential amplifiers 204. The signals added together are 90 degrees out of phase. The added signals also alternate between the inputs of the differential amplifier 204 due to the changing gate voltages.

A differential amplifier 204 is provided for each frequency band used by the transmitter. The differential amplifiers 204 may have configurations known in the art. In the embodiment shown in FIG. 2, the input signals are provided to the gates of a pair of matched CMOS transistors. The sources of the matched transistors are connected to a current source ($I_{bias}$). The gates of the matched transistors are connected a bias voltage $V_{cm}$ through a resistor ($R_{cm}$). The drains of the matched transistors are connected to sources of another set of transistors. The gates of the other set of transistors are supplied with the same bias voltage ($V_{bias}$). The drains of the other set of transistors are the outputs of the differential amplifier 204.

The differential amplifiers 204 have a negative feedback loop 206. In the embodiment shown, the negative feedback loop 206 is a capacitor. In other words, each output is connected with the associated input through a feedback capacitor ($C_{f1}$, $C_{f2}$). In addition, a bandpass filter 210 is connected to each output of the differential amplifiers 204. As shown, the bandpass filter 210 includes an LC tank circuit. The tank circuit contains a parallel combination of an inductor ($L^+$, $L^-$) and capacitor ($C^+$, $C^-$). The tank circuit passes the frequency range of the band of the particular differential amplifier 204. The outputs of the differential amplifiers 204 are then coupled to external elements via capacitors.

Figure 3:
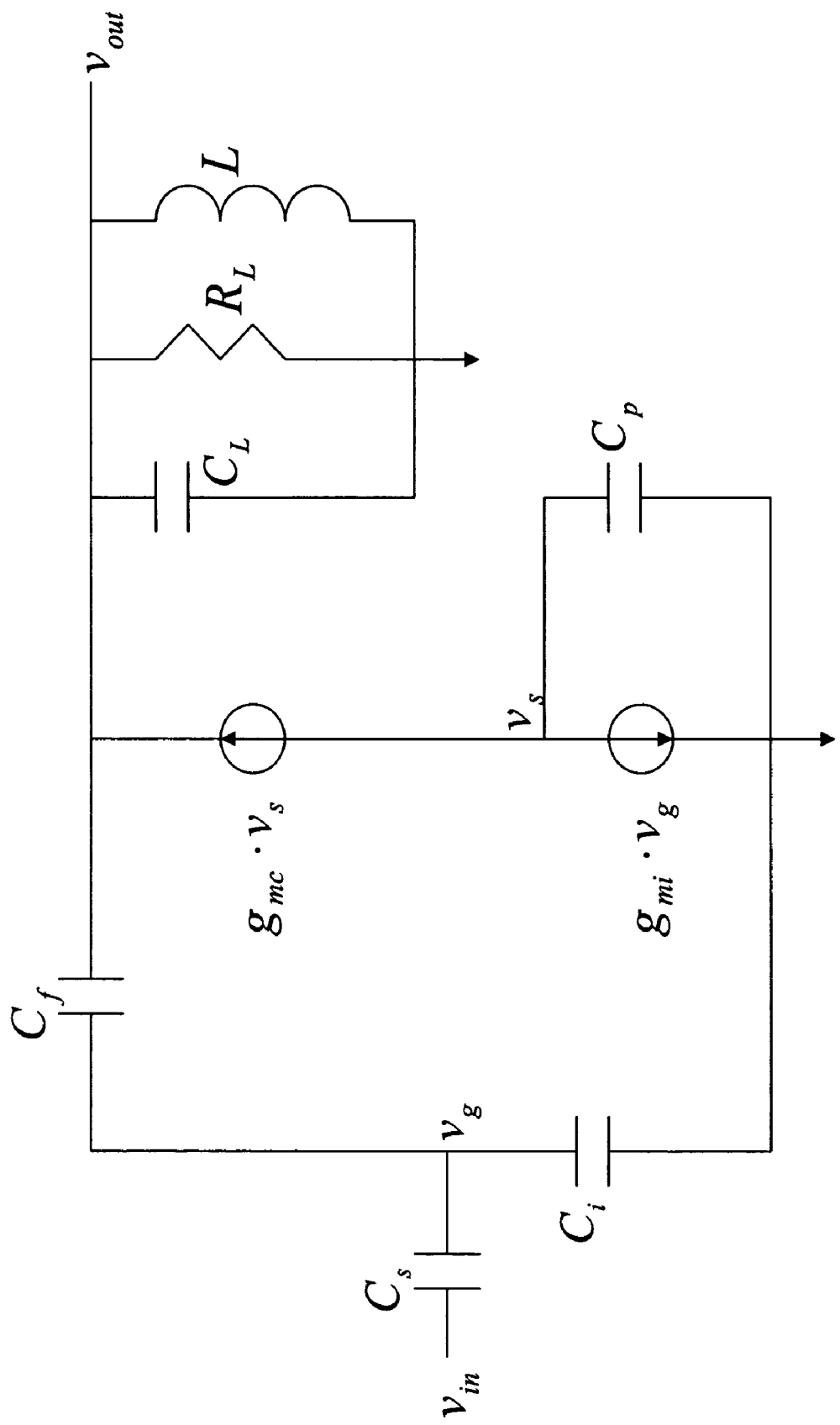
FIG. 3 shows the small-signal equivalent circuit of the closed-loop summing amplifier in one embodiment.

FIG. 3 shows the small-signal equivalent circuit of the differential amplifier 204. Analysis of current at the nodes shows the closed-loop gain can be expressed as given in equation (1). Since $C_f$ (0.1 to 1.0 pF) and $C_p$ (0.1 to 0.5 pF) $C_i$ (0.2 to 0.5 pF) are typically small values, if the tank circuit has large Q (the center frequency over the bandwidth) or $R_L$ and the input stage transconductance $g_{mi}$ is large, the closed-loop gain G(s) is determined primarily by $C_s/C_f$ and is thus essentially independent of the frequency of the signal. This is true no matter what the ambient temperature is or how the manufacturing process varies, even though the transconductance may be highly dependent on the ambient temperature and manufacturing process.

$$G(s) = \frac{-\frac{C_s}{C_f}}{1 + \frac{C_s + C_f + C_i}{C_f} \cdot \frac{\frac{1}{R_L} + s \cdot (C_L + C_f) + \frac{1}{s \cdot L}}{\frac{g_{mc}}{g_{mc} + s \cdot C_p} \cdot g_{mi} - s \cdot C_f}} \quad (1)$$

Simulations of the gain of the differential amplifier 204 were run versus process, temperature, and capacitor variations. As the modulating and combining circuit 104 may be an integrated structure, the capacitors may be formed using a conductor-insulator-conductor structure such as a metal-insulator-metal (MIM) structure rather than discrete components. Discrete components tend to increase the cost, size, and manufacturing time of the transmitter but may be used if desired. The results of the simulation looking at the typical process at room temperature, the worst-case process at 105 degrees C., and the best-case process at −40 degrees C., indicate that the gain is well controlled within a total variation range of 2.5 dB over a frequency range of 1.93 GHz to 1.99 GHz. This is well within the normal output of the transmitter, which is 0-5 dBm. It is notable that feedback in the structure shown does not introduce any stability issues in either the RF or GHz ranges, unlike the feedback loops in other transmitter circuits. In such circuits the positive feedback increases at these frequencies, making the circuits unstable.

Simulations of the third-order intermodulation indicate that the output third-order intermodulation is above +26 dBm, which is sufficient to provide good linearity to the power amplifier 106 downstream of the modulating and combining circuit 104.

As discussed above, low noise power output at some specified frequency offset from the carrier is specified for many communication protocols to reduce interference in the mobile receiver band. In GSM, this power is specified to be less than −79 dBm at 20 MHz offset, compared to a transmitter power of +33 dBm. This translates to the phase noise being below −162 dBc/Hz. The noise analysis from the small signal equivalent circuit of FIG. 3 shows that the output noise is given by equation (2), where $I_{ni}^2 = \frac{2}{3}g_{mi}kT$ and $I_{nc}^2 = \frac{2}{3}g_{mc}kT$. Due to the presence of the feedback capacitor, $C_f$, as the frequency increases, the output noise decreases, even though the negative feedback increases the noise floor by $(C_f+C_s+C_i)/C_f$.

$$\bar{v}_{out}^2 = \frac{g_{mc}^2 \cdot \bar{I}_{ni}^2 + \omega^2 \cdot C_p^2 \cdot \bar{I}_{nc}^2}{\left[\frac{C_f}{C_f + C_i + C_s} \cdot \left(g_{mi} \cdot g_{mc} + \frac{g_{mc}}{R_L} + \omega^2 \cdot C_f \cdot C_p\right)\right]^2 + \omega^2 \cdot \left(\frac{C_p}{R_L} - \frac{g_{mc} \cdot C_f^2}{C_f + C_i + C_i}\right)^2} \quad (2)$$

Note that unlike resistors, capacitors placed at the input of the differential amplifier 204 do not increase the noise. Thus, although it may seem like the topology increases the amount of noise due to additional noise sources of the active components, simulations of the topology show a structure with improved noise characteristics. For example, the phase noise at the output of the differential amplifier 204 decreases substantially linearly, on a log-log scale of phase noise vs. frequency, from 10 KHz to about 1 MHz, where the reduction in phase noise starts to bottom out and become constant with frequency. The result is a phase noise at 20 MHz offset of below −170 dBc/Hz, which is below the requirement for GSM. The phase noise of the total modulating and combining circuit 104, with the presence of the switches and the quadrature local oscillator, decreases substantially linearly, again on a log-log scale of phase noise vs. frequency, from 10 KHz to 20 MHz. The result is a phase noise at 20 MHz offset below −163 dBc/Hz, which is still lower than the GSM requirement. Of course, if the phase noise of the quadrature local oscillator can be improved, the overall phase noise of the modulating/combining circuit 104 will be further improved.

Figure 4:
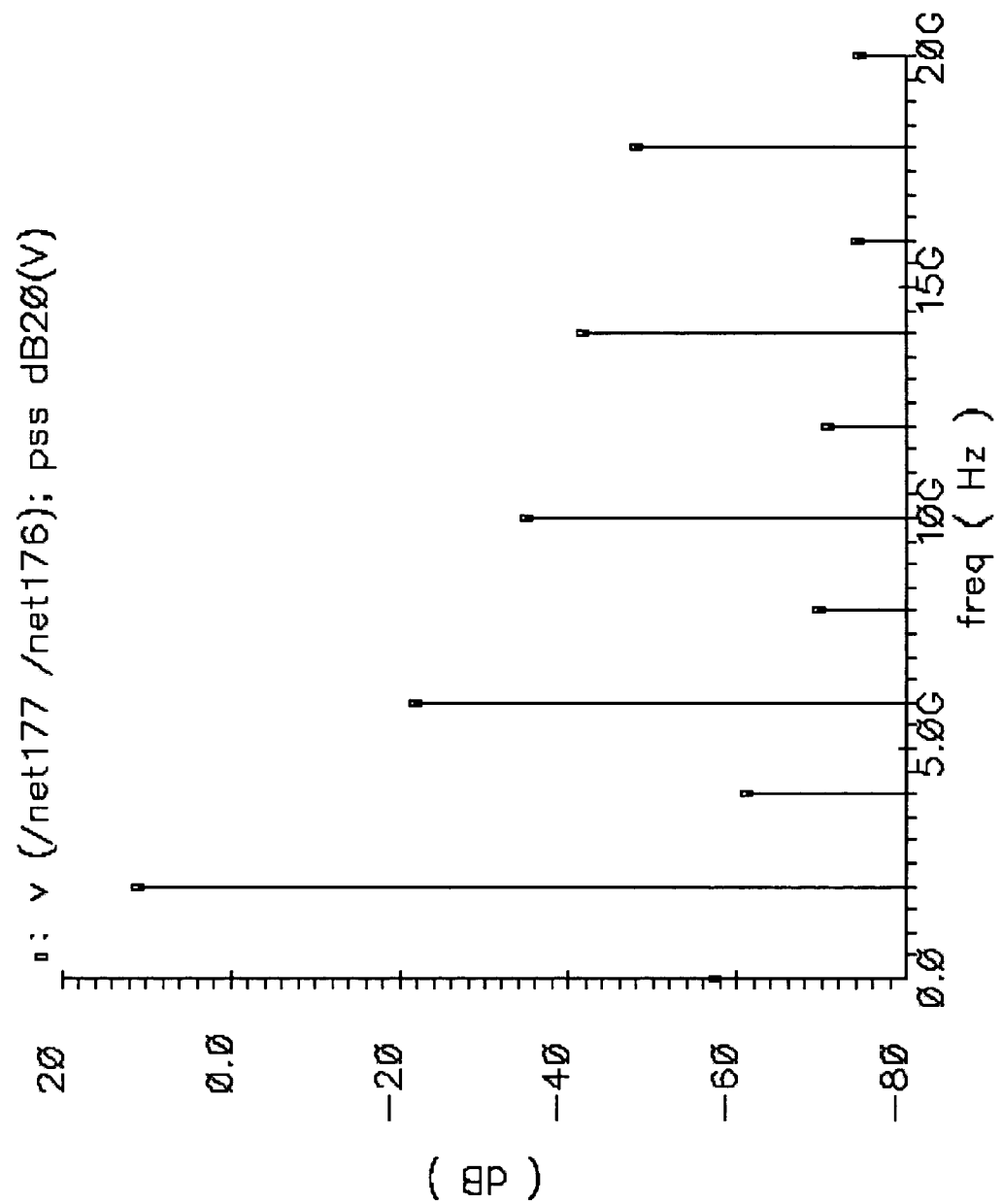
FIG. 4 shows a spectrum at the output of the modulating and combining circuit in one embodiment.

The harmonics generated by the local oscillator are attenuated by the LC tank circuit 210 at the output of the differential amplifier 204. FIG. 4 shows the spectrum at the output of the modulator. As is indicated by this simulation, the harmonics are all at least 30 dB below the fundamental carrier, which is the signal at about 2 GHz. Further simulations show that minimal spectrum regrowth exists in the power amplifier due to linearity of the modulating and combining circuit.

The current drawn by the local oscillator (not shown) is about 20 mA in some simulations and the current drawn by the summing circuit 202, which generates the in-phase and quadrature-phase LO signal is about 21.4 mA in these simulations. Thus, the currents drawn are relatively low, saving battery life and permitting this topology to compete with other schemes such as full-polar modulation, frequency-offset modulation, and direct frequency modulation.

Due to the feedback topology of the modulating and combining circuit 104, the stability conditions have been simulated to prevent possible unintended oscillation. To check the stability conditions, the loop gain was simulated by inserting a test element in the feedback loop. Simulations of the amplitude and phase of the loop gain under typical process conditions and operating the transmitter at room temperature indicate that the loop gain is always below 0 dB from DC to 10 GHz. The circuit is stable under these conditions. Simulations of the amplitude and phase of the loop gain for slow process conditions and operating the device at an ambient temperature of +85 degrees C. showed, similar to the previous conditions, that the circuit was stable. Simulations of the amplitude and phase of the loop gain for fast process conditions and operating the device at an ambient temperature of −40 degrees C. show a positive gain and but with around 141 degrees phase margin.

For transmitters, one of the main design criterions is how much the data is distorted by the transmitter circuits before it is sent to the transmission channel. Simulations indicate that the differential amplifier adds very little phase shift. The adjacent channel power, in the band between −2 MHz to −1 MHz, over the signal power, in the band from −1 MHz to 1 MHz, is −61.4 dB. The adjacent channel power, in the band between 1 MHz to 2 MHz, over the signal power, in the band from −1 MHz to 1 MHz, is −61.2 dB.

Figure 5:
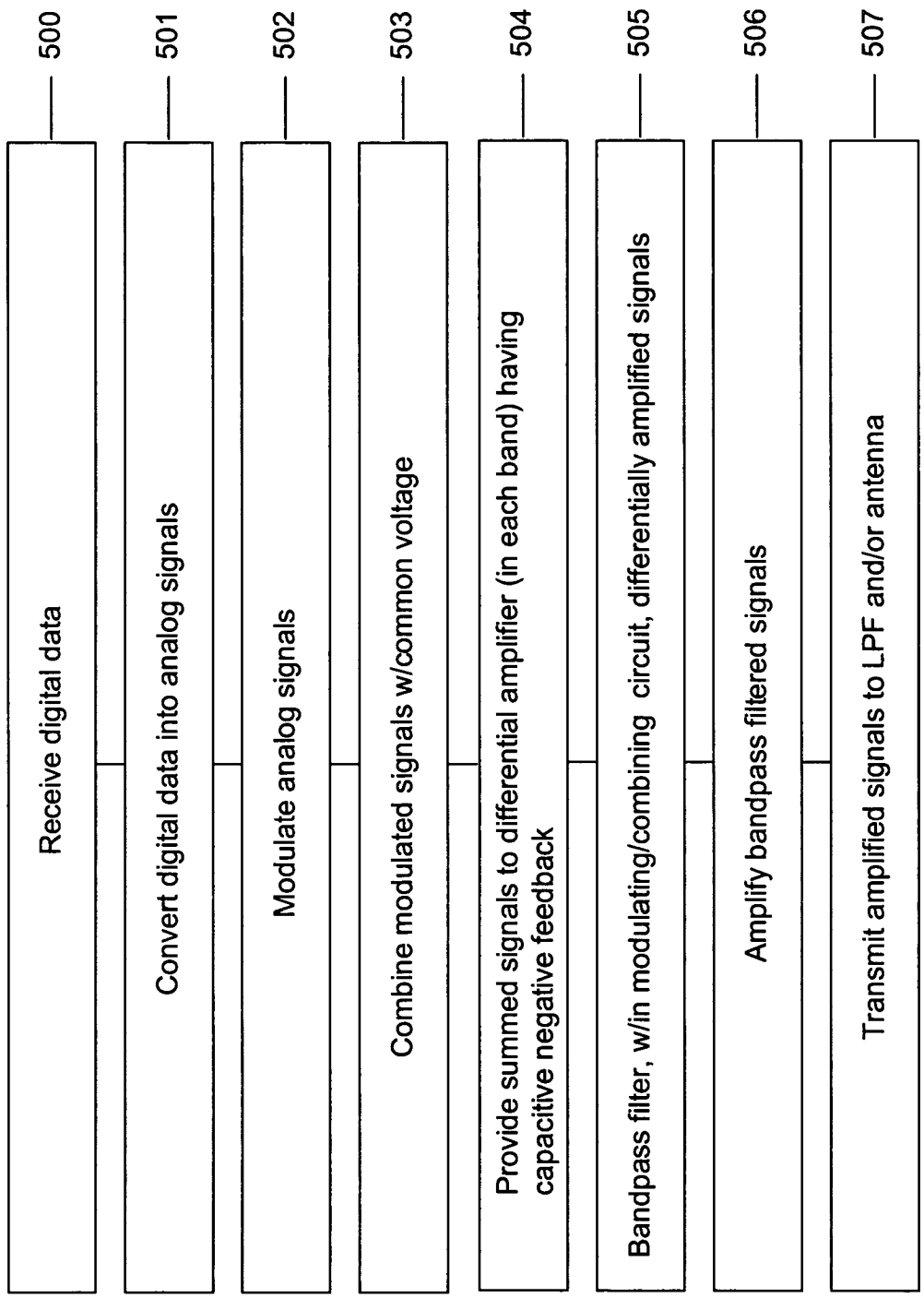
FIG. 5 is a flow chart demonstrating signal flow in one embodiment.

As shown in the flow chart schematic of FIG. 5, the transmitter receives digital data 500. This digital data is converted into analog signals in a D/A converter 501 and then supplied to a modulating and combining circuit where the data modulates the carrier 502. The resulting modulated signals are fed to a capacitor and then combined 503 and supplied to a differential amplifier 504. The differential amplifier has capacitive negative feedback between the input and the output. A bandpass filter formed by an LC tank circuit is connected to the outputs of the differential amplifier. The LC tank circuit bandpass filters the signals from the differential amplifier 505. The filtered output is supplied to outputs of the modulating and combining circuit and eventually to a power amplifier, which amplifies the signals 506. The amplified signals are then supplied to an antenna 507, perhaps after low pass filtering them. Multiple differential amplifiers in the modulating and combining circuit can be used to supply signals in various different bands using LC tank circuits with different frequencies as the characteristics of the differential amplifier is essentially constant over the frequency ranges of interest.

In summary, transmitter specifications can be satisfied over a wide range of ambient temperatures in which the device operates. In addition, transmitter specifications can be satisfied over a wide range of processing conditions when forming the integrated circuit. The transmitting power is stable, thereby avoiding burying of other signals being transmitted to a cell tower. A capacitive feedback loop in the modulating and combining circuit increases the linearity. This decreases the distortion fed to the downstream power amplifier and accordingly the third-order intermodulation caused by amplitude distortion of the power amplifier. The amount of harmonics is also reduced, as is the dependence of the structure on the transconductance found in open loop structures.

The topology thus has stable transmitter gain, high third-order intermodulation, low phase noise, and a sufficient amount of harmonic reduction to be viable for GSM communications. The current consumed in by the differential amplifier is about 20 mA and the current drawn by the local oscillator circuits is about 21.4 mA. Thus, the total amount of current used is relatively small. Thus, this topology results in the ability to remove the SAW filter in the transmitter, thereby decreasing the cost, part count, and easing the design specifications for the power amplifier.

The capacitors used in the circuits shown are typically in the 1 pF to 10 pF range and the resistors are in the 1K to 10K ohm range. The inductors are in the 5 nH to 15 nH range to resonate with the capacitors in the 1 GHz and 2 GHz band. These values are only typical values: other values for the capacitors, resistors, and inductors may be used. More specifically, $C_s$ are less than 10 pF and are typically 1-5 pF; $C_f$ are less than 1 pF and are typically 0.1-0.5 pF; $C_i$ are less than 0.5 pF and are typically 0.1-0.2 pF; $C_p$ are less than 0.5 pF and are typically 0.1-0.2 pF; $C_L$ are less than 10 pF and are typically 1-4 pF; the capacitors located at $v_{rf+}$ and $v_{rf-}$ are 1-10 pF; L are less than 15 nH due to size and self-resonant frequency constraints and are typically 5-15 nH; $R_L$ are typically 2-4K$\Omega$ but are dependent on the inductor Q; $R_{cm}$ are larger than 10K$\Omega$ and are typically 10K-100K$\Omega$; $R_I$ are less than 10K$\Omega$ and are typically 1-10K$\Omega$; $R_Q$ are less than 10K$\Omega$ and are typically 1-10K$\Omega$. Although the circuitry disclosed herein has been described in the context of a transmitter, alternate embodiments of the disclosed circuitry may use the disclosed circuitry in any desired manner for any desired purpose.

Other designs are possible. The size of the transistors in the differential amplifier can be optimized to get even better design margins. The feedback capacitors can be put in a programmable array so that the modulating and combining circuit becomes a variable gain amplifier. Although input and feedback capacitors are used, it may be possible to use other elements and/or circuits. For example, resistors may be used. Alternatively inductors may be used. Similarly, a separate low pass filter may not be used, thereby decreasing signal attenuation in the passband.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

I claim:

1. A communication circuit comprising:
   a summing circuit adapted to supply a first sum containing an in-phase signal and a quadrature-phase signal and a second sum containing an inverted in-phase signal and an inverted quadrature-phase signal;
   a plurality of differential amplifiers, wherein each of the plurality of differential amplifiers contains a plurality of inputs and outputs adapted to receive the first and second sums, and wherein each of the plurality of differential amplifiers amplifies a desired frequency band of a plurality of frequency bands;
   a plurality of feedback circuits, wherein each of the plurality of feedback circuits contains a first element connected between an input and an output of one of the plurality of differential amplifiers; and
   a bandpass filter connected with the output of each of the plurality of differential amplifiers, wherein the bandpass filter passes the desired frequency band.

2. The communication circuit of claim 1, further comprising a second element through which the in-phase signal, the quadrature-phase signal, the inverted in-phase signal, and the inverted quadrature-phase signal pass before being supplied to the differential amplifier, the first and second elements containing capacitors.

3. The communication circuit of claim 2, wherein the first and second elements have values such that magnitudes of output signals at the output of the differential amplifier are greater than input signals at the input of the differential amplifier and the output signals are inverted with respect to the input signals.

4. The communication circuit of claim 1, wherein the bandpass filter is disposed in parallel with the output of the differential amplifier.

5. The communication circuit of claim 1, wherein signals supplied to the summing circuit are coupled together by switches to form the first and second sums.

6. The communication circuit of claim 1, wherein the summing circuit further comprises:
    a first input adapted to receive a first combination of a common voltage and an in-phase baseband signal, a second input adapted to receive a second combination of the common voltage and an inverted in-phase baseband signal, a third input adapted to receive a third combination of the common voltage and a quadrature-phase baseband signal, and a fourth input adapted to receive a fourth combination of the common voltage and an inverted quadrature-phase baseband signal;
    first and second transistors having sources connected to the first combination through a first resistor, third and fourth transistors having sources connected to the second combination through a second resistor, fifth and sixth transistors having sources connected to the third combination through a third resistor, and seventh and eighth transistors having sources connected to the fourth combination through a fourth resistor, gates of the first, fourth, fifth and eighth transistors connected to a local oscillator signal, gates of the second, third, sixth and seventh transistors connected to an inverted local oscillator signal, drains of the first and third transistors connected together to form a first set, drains of the second and fourth transistors connected together to form a second set, drains of the fifth and seventh transistors connected together to form a third set, drains of the sixth and eighth transistors connected together to form a fourth set, the first and third set connected together through first capacitors to form the first sum, and the second and fourth set connected together through second capacitors to form the second sum, the drain of each of the transistors connected to the common voltage through a resistor, the first elements containing the first and second capacitors.

7. A transmission system comprising:
    a digital-to-analog (D/A) converter adapted to receive digital data;
    a modulating and combining circuit disposed downstream from the D/A converter, the modulating and combining circuit having a summing circuit and a differential amplifier, the summing circuit supplying combinations of any two or more signals from the group of: an in-phase signal, a quadrature-phase signal, an inverted in-phase signal, and an inverted quadrature-phase signal to an input of the differential amplifier, the differential amplifier having negative feedback between the input and an output;
    a power amplifier connected downstream of the modulating and combining circuit; and
    an antenna connected downstream of the power amplifier;
    wherein the summing circuit comprises a first capacitor connected with the input of the differential amplifier, and
    wherein the negative feedback comprises a second capacitor connected between the input and output.

8. The transmission system of claim 7, wherein the modulating and combining circuit further comprises a bandpass filter connected with the output of the differential amplifier.

9. The transmission system of claim 7, wherein the output of the transmitter is supplied directly to the power amplifier.

10. The transmission system of claim 7, wherein the modulating and combining circuit contains a differential amplifier for each frequency band.

11. A communication circuit comprising a modulating and combining circuit, the modulating and combining circuit comprising:
    a summing circuit operative to combine signals in the communication circuit;
    a differential amplifier connected with the summing circuit via an input capacitance to receive the combined signals;
    capacitive negative feedback means for providing feedback between inputs and outputs of the differential amplifier, the capacitive negative feedback means comprising a feedback capacitance such that the differential amplifier is configured to provide closed-loop gain determined by a ratio of the input and feedback capacitances; and
    a bandpass filter connected in parallel with the output of the differential amplifier.

12. A method comprising:
    modulating analog signals in a modulating and combining circuit of a transmitter, the modulated analog signals containing an in-phase signal, a quadrature-phase signal, an inverted in-phase signal and an inverted quadrature-phase signal;
    summing the modulating analog signals, a first summed signal containing the in-phase signal and the quadrature-phase signal and a second summed signal containing the inverted in-phase signal and the inverted quadrature-phase signal;
    providing the first summed signal to a first input of a differential amplifier with a first negative feedback between the first input and a first output of the differential amplifier;
    providing the second summed signal to a second input of the differential amplifier with a second negative feedback between the second input and a second output of the differential amplifier;
    selecting outputs of the transmitter from a plurality of frequency bands; and
    providing an additional differential amplifier in the transmitter for each frequency band.

13. The method of claim 12, further comprising:
    converting digital data to the analog signals;
    combining the analog signals with a on voltage, wherein the summing is of the combined signals;
    amplifying signals from the differential amplifier; and
    transmitting the amplified signals from an antenna.

14. The method of claim 12, further comprising alternating the signals supplied to the inputs of the differential amplifier using switches.

15. The method of claim 12, wherein providing negative feedback comprises capacitively coupling the input and output of the differential amplifier and capacitively coupling the first and second summed signals to the input of the differential amplifier.

16. The method of claim 12, further comprising providing the bandpass filtering within the modulating and combining circuit.

17. The method of claim 12, further comprising supplying the LC tank circuit as the only source of bandpass filtering between the modulating and combining circuit and an antenna.

18. The method of claim 12, further comprising providing the first and second summed signals to different inputs of each of the differential amplifiers.

19. The method of claim 12, further comprising forming the in-phase signal, quadrature-phase signal, inverted in-phase signal and inverted quadrature-phase signal from a signal input to the transmitter.

20. The method of claim 12 further comprising:
filtering the first output of the differential amplifier with a first filter in parallel with the first output of the differential amplifier; and
filtering the second output of the differential amplifier with a second filter in parallel with the second output of the differential amplifier.

21. The transmission system of claim 7, wherein the negative feedback comprises a third capacitor.

22. The transmission system of claim 7, wherein the summing circuit and the first capacitor are separated from the negative feedback and the second capacitor.

* * * * *